United States Patent [19]

Minato

[11] Patent Number: 5,144,402
[45] Date of Patent: Sep. 1, 1992

[54] SEMICONDUCTOR SWITCHING DEVICE AND METHOD OF CONTROLLING A CARRIER LIFE TIME IN A SEMICONDUCTOR SWITCHING DEVICE

[75] Inventor: Tadaharu Minato, Itami, Japan
[73] Assignee: Mitsubishi Denki Kabushiki Kaisha, Tokyo, Japan
[21] Appl. No.: 233,823
[22] Filed: Aug. 10, 1988

[30] Foreign Application Priority Data

Aug. 19, 1987 [JP] Japan ............... 62-206856

[51] Int. Cl.[5] ............... H01L 29/74; H01L 27/14
[52] U.S. Cl. ............... 357/38; 357/29; 357/91
[58] Field of Search ............... 357/38, 29, 37, 52, 357/91

[56] References Cited

U.S. PATENT DOCUMENTS

| | | | |
|---|---|---|---|
| 4,281,336 | 7/1981 | Sommer et al. | 357/38 |
| 4,314,595 | 2/1982 | Yamamoto et al. | 357/91 |
| 4,370,180 | 1/1983 | Azuma et al. | 357/11 |
| 4,511,913 | 4/1985 | Nagano | 357/51 |
| 4,710,792 | 12/1987 | Suzuki | 357/38 |

OTHER PUBLICATIONS

Solid-State Electronics vol. 30, No. 2, pp. 185-188, 1987 "Temperature Behavior and Annealing of Insulated Gate Transistors Subjected to Localized Lifetime Control by Proton Implantation".

The Report of Hosei University Ion Beam Engineering Laboratory, Separate vol. 6, 1987, pp. 93-98, Japan, "Production of Static Induction Thyristors by Proton Irradiation".

Primary Examiner—Andrew J. James
Assistant Examiner—Ngan Van Ngo
Attorney, Agent, or Firm—Oblon, Spivak, McClelland, Maier & Neustadt

[57] ABSTRACT

A semiconductor layer, through which a main current flows, is so structured that a carrier life time in the semiconductor layer is ununiform in accordance with a predetermined distribution of the carrier life time. Thus, turn OFF characteristics of a semiconductor switching device can be improved without causing any unacceptable disadvantages for other characteristics.

1 Claim, 4 Drawing Sheets

SEMICONDUCTOR SWITCHING DEVICE AND METHOD OF CONTROLLING A CARRIER LIFE TIME IN A SEMICONDUCTOR SWITCHING DEVICE

BACKGROUND OF THE INVENTION

1. Field of the Invention

The present invention relates to a semiconductor switching device such as a thyristor and a method of controlling a carrier life time in a semiconductor switching device.

2. Description of the Background Art

It is known in the art to control a carrier life time in a semiconductor switching device by irradiating the semiconductor switching device with a radiation, such as an electron beam, a proton beam, alha rays and gramma rays, to cause radiation defects, or lattice defects in wide sense. An example, in which a buried gate type static induction thyristor (hereinafter referred to as an SI thyristor) is irradiated with a radiation, will be described.

FIG. 1 is a cross-sectional view schematically showing the main portion of a structure of a conventional SI thyristor which has radiation defects caused by irradiation with a radiation. FIG. 2 is a view showing a process of irradiating an SI thyristor with a radiation.

Referring to FIG. 1, the SI thyristor comprises an N type semiconductor substrate 1, an anode region 2 which is formed on the back surface of the semiconductor substrate 1 by diffusing P type impurities, a cathode region 3 which is formed on the top surface of a jut of the semiconductor substrate 1 by diffusing N type impurities, and gate regions 4 which are formed on step portions of the semiconductor substrate 1 by diffusing P type impurities. A main current 9 flows through a channel region 5, which is surrounded by the gate regions 4.

This SI thyristor is irradiated with a radiation 10 such as an electron beam to cause radiation defects 7 in the semiconductor substrate 1, as shown in FIG. 2. The radiation defects 7 are uniformly distributed all over the irradiated portion of the semiconductor substrate 1, since the radiation defects 7 are caused by the interaction of the radiation 10 and atoms forming the semiconductor substrate 1. In FIG. 1 and FIG. 2, however, the radiation defects 7 are shown by only some cross marks for the convenience of illustration.

The operation of the SI thyristor, in the condition that a carrier life time is uniformly decreased all over the semiconductor substrate 1 due to the radiation defects 7, will now be roughly described. In this context "carrier life time" is directed to how long carriers can live on the average. This is a matter of probability as to whether or not carriers can be left alive to reach the main electrod without being trapped by defect. In an ON state, the main current 9 flows from the anode region 2 to the cathode region 3 through the channel region 5 against the interruption of the radiation defects 7, while many carriers 8 are trapped by the radiation defects 7. At the moment of a turn OFF of the SI thyristor, a number of carriers remain in the semiconductor substrate 1. If the life time of the carriers is long, the substantial turn OFF time of the SI thyristor becomes long. However, the SI thyristor shown in FIG. 1 has a number of radiation defects 7 which serve as a life time killer to the carriers, and hence the turn OFF time of the SI thyristor is decreased in the form of the decrease of a tail current. Thus, the switching loss of the SI thyristor in a turn OFF transistion is greatly decreased by irradiating the SI thyristor with the radiation 10 to control a carrier life time.

However, such uniform irradiation of the semiconductor substrate 1 with the radiation 10 causes a number of radiation defects 7 in the channel region 5 through which the main current 9 flows, so that the forward voltage of the SI thyristor in an ON state is disadvantageously increased, mainly due to the decrease of a carrier life time in the channel region 5. The increase of the forward voltage results in the increase of a power loss in an ON state. Especially in a high breakdown voltage device such as a device having a higher breakdown voltage than 1500 V, such increase of the forward voltage causes unacceptable ON state power loss and exothermic device destruction, since such a device generally has a substrate having a high specific resistance.

Further, at the initial stage of a turn ON transition, carriers must progress against the radiation defects 7, in other words, the main current 9 must flow in the substrate 1 having a specific resistance increased by the radiation defects 7, and hence the turn ON time of the SI thyristor is increased.

If the SI thyristor is uniformly irradiated with a lot of radiation 10 to perform a strong life time control, a leak current in an OFF state is increased due to the occurrence of defects in a passivation film (not shown) and/or the deterioration of a surface condition of the substrate 1, and a main breakdown voltage is decreased due to the increase of a leak current at the exposed edges of P-N junctions defined by the substrate 1 and the gate regions 4.

In a MOS type transistor, such as MOSFET, other than a bipolar type high breakdown voltage switching device such as an Insulated Gate Bipolar Transistor (hereinafter referred to as an IGBT), a gate portion includes an insulator such as a silicon oxide film. Therefore, if the MOS type transistor is irradiated with a radiation to control a carrier life time, various surface states, which are induced in the gate portion, make controlling through a gate difficult, in addition to the problems as hereinbefore described.

Thus, the life time control of a semiconductor switching device by the irradiation of a radiation such as an electron beam has the advantage of decrease of a turn OFF time and the disadvantages of increase of a turn ON time as well as a forward voltage, and in some cases decrease of a breakdown voltage. The advantage and disadvantages are in a trade-off relationship, so it is difficult to appropriately accommodate the trade-off relationship for particular use of the semiconductor switching device.

A method of partly recovering deteriorated characteristics is conventionally widely used, wherein a semiconductor switching device irradiated with a radiation is subjected to an annealling process to recover a crystal structure. Through the annealling process, the deteriorated characteristics are uniformly recovered, since a whole semiconductor switching device is only put into an uniformly high temperature condition in the anneal processing. Therefore, this annealling process is equivalent to work for selecting optimum quantity of irradiation of a radiation to implement a device having desired characteristics, and hence the problems as hereinbefore described can not be solved in essence through the annealling process.

SUMMARY OF THE INVENTION

According to the first aspect of the present invention, a semiconductor switching device has a semiconductor layer through which a main current flows. This semiconductor layer is so structured that a carrier life time in the semiconductor layer is ununiform in accordance with a predetermined distribution of the carrier life time.

According to the second aspect of the present invention, a method of controlling a carrier life time in a semiconductor switching device, having a semiconductor layer through which a main current flows, comprises the steps of preparing a semiconductor switching device and a radiation source for emitting a radiation, and irradiating the semiconductor switching device with the radiation emitted from the radiation source to cause radiation defects distributed in the semiconductor layer, in predetermined space and density distributions of the radiation defects.

Accordingly, it is an object of the present invention to provide a semiconductor switching device and a method of controlling a carrier life time in a semiconductor switching device, in which turn OFF characteristics of a semiconductor switching device can be improved without causing any unacceptable disadvantage for other characteristics.

These and other objects, features, aspects and advantages of the present invention will become more apparent from the following detailed description of the present invention when taken in conjunction with the accompanying drawings.

DETAILED DESCRIPTION OF THE INVENTION

Figure 1:
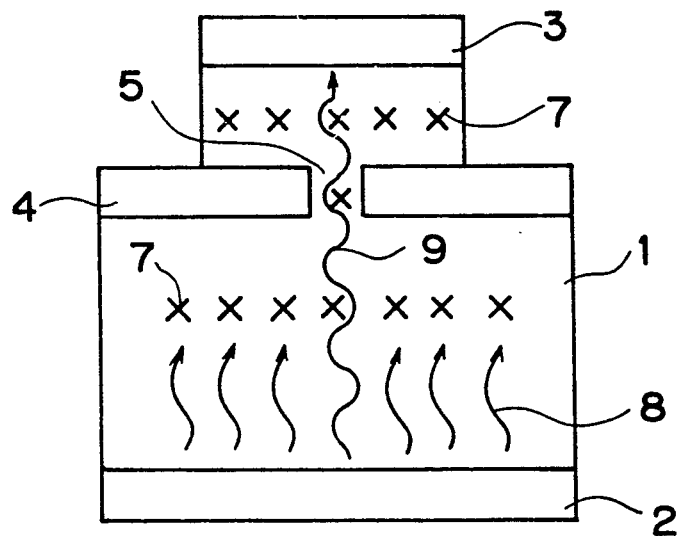
FIG. 1 is a cross-sectional view schematically showing the main portion of a structure of a conventional SI thyristor which has radiation defects caused by irradiation with a radiation.
Figure 2:
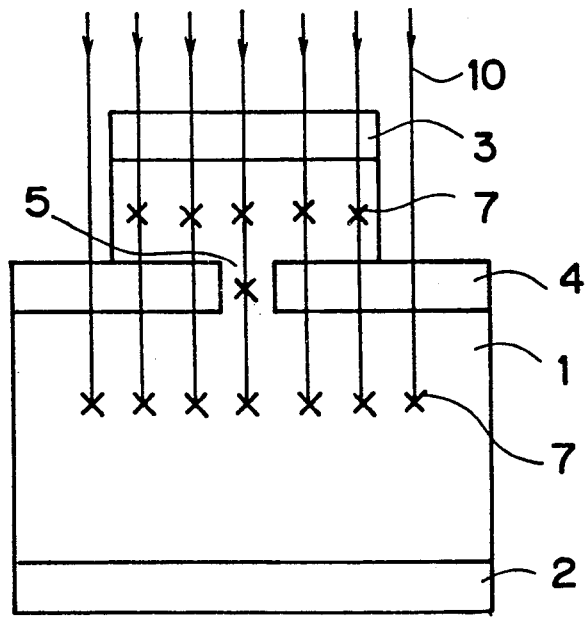
FIG. 2 is a view showing a process of irradiating an SI thyristor with a radiation.
Figure 3:
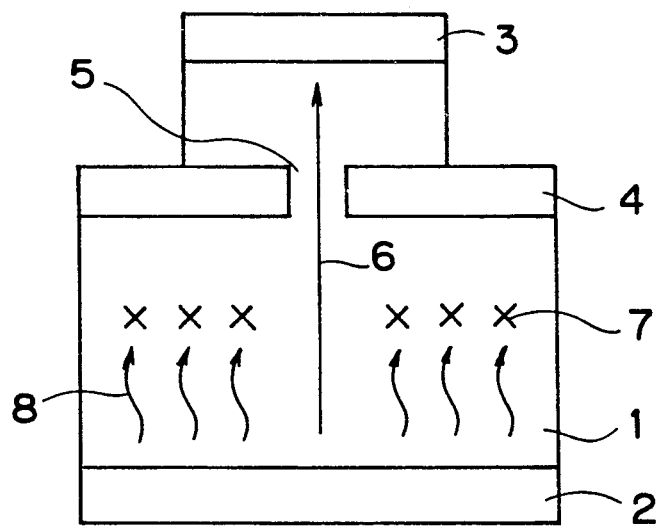
FIG. 3 is a cross-sectional view schematically showing the main portion of a structure of an SI thyristor according to an embodiment of the present invention.

FIG. 3 is a cross-sectional view schematically showing the main portion of a structure of an SI thyristor according to an embodiment of a semiconductor switching device in accordance with the present invention. Referring to FIG. 3, this SI thyristor has an N type semiconductor substrate 1. An anode region 2 is formed on the back surface of the semiconductor substrate 1 by diffusing P type inpurities. A cathode region 3 is formed on the top surface of a jut of the semiconductor substrate 1 by diffusing N type impurities. Gate regions 4 are formed on step portions of the semiconductor substrate 1 by diffusing P type impurities. A channel region 5, through which a main current 6 flows, is surrounded by the gate regions 4.

Figure 4:
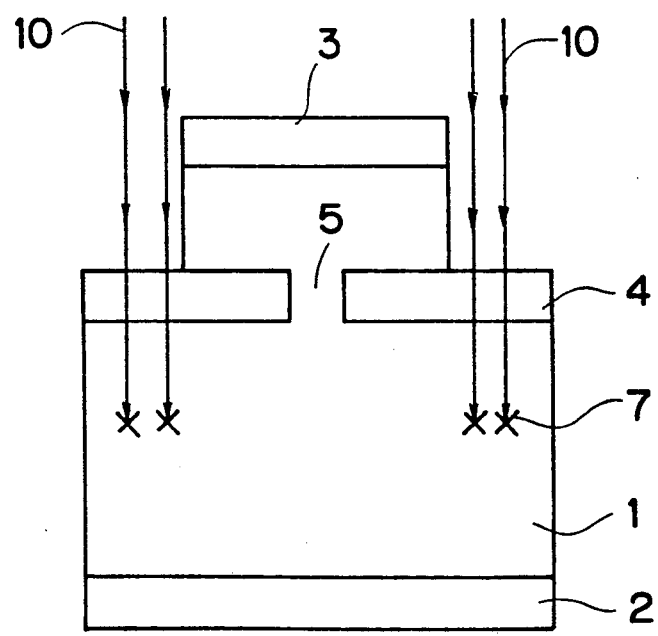
FIG. 4 is a view showing an example of the irradiation of an SI thyristor with a radiation in accordance with the present invention.

This SI thyristor is irradiated with a radiation 10 such as an electron beam to cause radiation defects 7 in desired portions of the semiconductor substrate 1. FIG. 4 is a view showing an example of the irradiation of the SI thyristor with the radiation 10 in accordance with the present invention. Referring to FIG. 4, the SI thyristor is selectively irradiated with the radiation 10. As a result, the radiation defects 7 are densely and uniformly caused only in the irradiated portions, i.e., peripheral portions of the semiconductor substrate 1. In FIG. 3 and FIG. 4, the radiation defects 7 are shown by only some cross marks for the convenience of illustration.

In an ON state, the main current 6 flows from the anode region 2 to the cathode region 3 through the channel region 5 without being interrupted by the radiation defects 7 in the central portion of the substrate 1, while some carriers 8 are trapped by the lattice defects 7. Thus, the forward voltage of the SI thyristor is not so increased in spite of the presence of the lattice defects 7.

At the moment of a turn OFF of the SI thyristor, a number of carriers remain in the semiconductor substrate 1. The radiation defects 7 serve as a life time killer, so that the life time of the carriers decreased. Thus, the turn OFF time of the SI thyristor is sufficiently decreased in the form of the decrease of a tail current, as is similar to the conventional SI thyristor hereinbefore described.

At the initial stage of a turn ON transition, carriers can progress without being interrupted by the radiation defects 7 in the central portion of the substrate 1. Thus, the turn ON time of the SI thyristor is not so increased in spite of the presence of the radiation defects 7.

Even if the SI thyristor is irradiated with a lot of radiation 10 to perform a strong life time control, damages due to the much radiation are only partially caused because of the selective irradiation. That is, the occurrence of defects in a passivation film (not shown) and the deterioration of a surface condition of the substrate 1 are limited to be partial, and hence a leak current in an OFF state is not so increased. Further, in a MOS type transistor, if the irradiation of the MOS type transistor with a radiation is performed exclusive of a gate portion having an insulation film, it can not be caused that various surface states are induced in the gate portion to make a control through a gate difficult.

Thus, according to the embodiment, turn OFF characteristics of a semiconductor switching device can be improved without causing any disadvantages, such as unacceptable increase of a turn ON time and a forward voltage.

Figure 5:
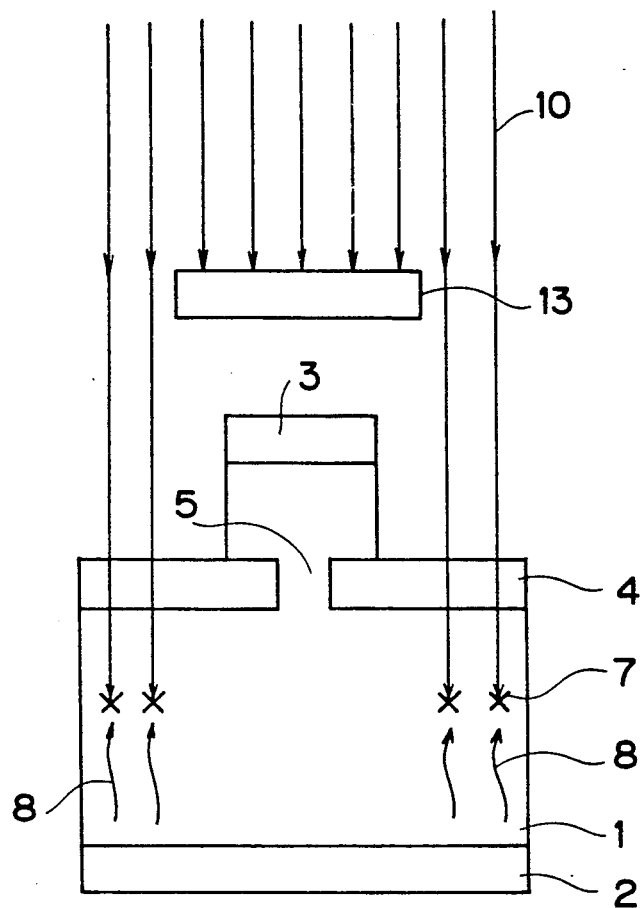
FIG. 5 and FIG. 6 are views showing examples of a structure for irradiating an SI thyristor with a radiation.
Figure 6:
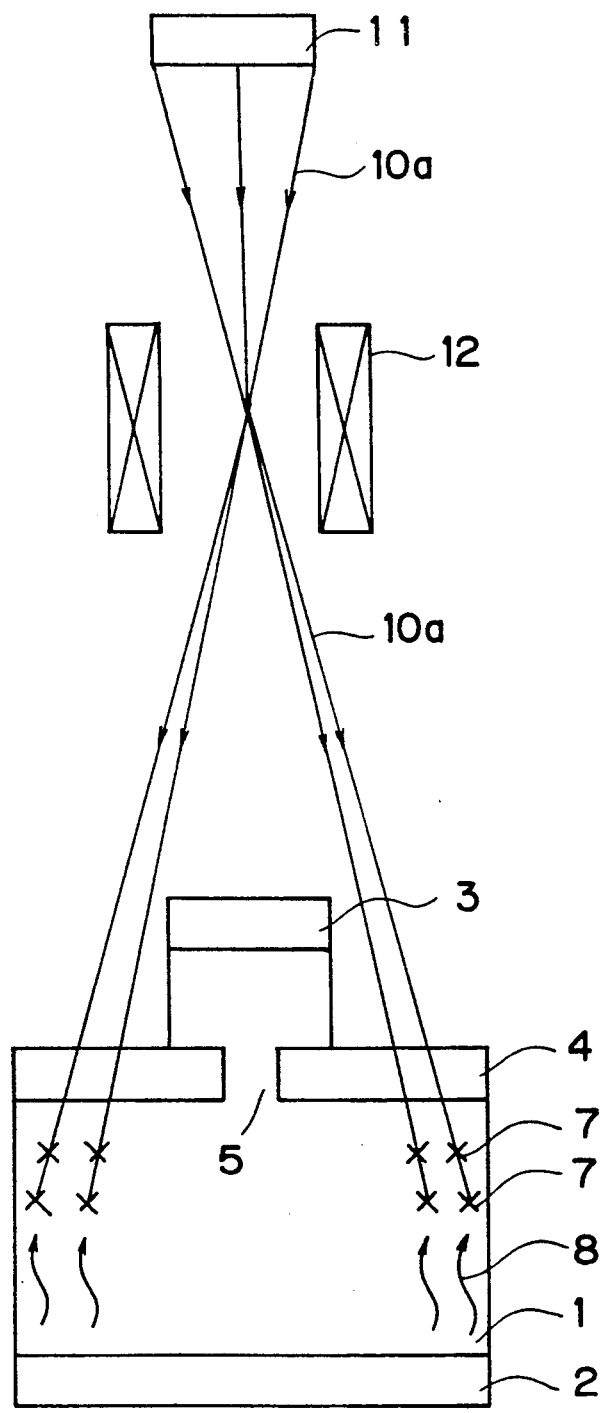

FIG. 5 and FIG. 6 are views showing examples of a structure for irradiating an SI thyristor with a radiation. Referring to FIG. 5, a shading plate 13 is placed above an SI thyristor so that a radiation 10 proceeding to the central portion of the SI thyristor is blocked. Thus, the SI thyristor can be irradiated with the radiation 10 only in the peripheral portion thereof.

Referring to FIG. 6, a radiation source 11 and an electromagnetic lens 12 are placed above an SI thyristor. The radiation source 11 emits a charged particle beam 10a which is scanned by the electromagnetic lens 12 to irradiate the desired portion of the SI thyristor. Thus, the SI thyristor can be irradiated with the charged particle beam 10a, which is a kind of radiation, only in the peripheral portion thereof.

Figure 7:
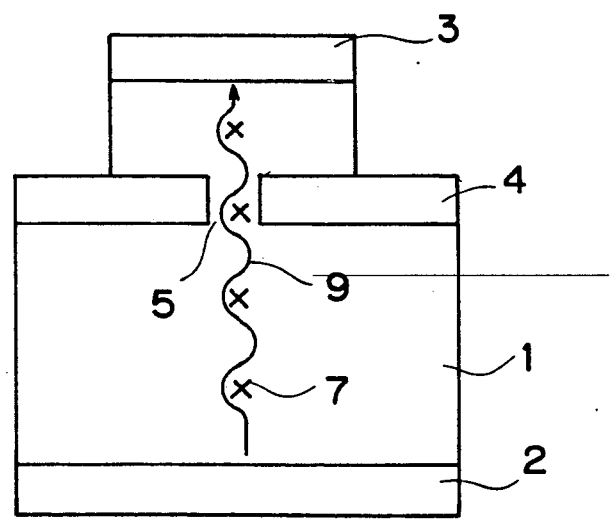
FIG. 7 is a cross-sectional view showing an SI thyristor according to another embodiment of the present invention.

FIG. 7 is a cross-sectional view showing an SI thyristor according to another embodiment of the semiconductor switching device in accordance with the present invention. Referring to FIG. 7, radiation defects 7 are cased only in the central portion of a semiconductor substrate 1. This SI thyristor is so structured that the increase of a turn ON time and a forward voltage, due to the radiation defects 7 distributed mainly in a main current path, is compensated by the portion of an anode region 2 not corresponding to the main current path. Namely, the impurity concentration of the anode region 2 is relatively high in the peripheral portion thereof to increase a carrier injection efficiency from the anode region 2 to the semiconductor substrate 1, to thereby decrease the turn ON time and the forward voltage. According to this embodiment, radiation defects 7 in a channel region 5 operates to shorten the life time of carriers in the channel region 5, to hasten the pinch-off of the channel region 5 in a turn OFF transition. In addition, radiation defects 7 in the semiconductor substrate 1 decrease a tail current in the turn OFF transition. Thus, the turn OFF time of this SI thyristor is much decreased. If the semiconductor substrate 1 is thick so that a distance between the peripheral portion of the anode region 2 and the channel region 5 is longer than the mean free path of carriers, carriers injected from the peripheral portion of the anode region 2 disappear before they reach the channel region 5 in the turn OFF transition, so that the turn OFF time is further decreased.

In general, the structure shown in FIG. 7 is effective to much decrease a turn OFF time, in the case that the increase of a turn ON time and a forward voltage due to the radiation defects 7 in the central portion of the substrate 1 is allowable. That is, if the SI thyristor shown in FIG. 7 has a wide anode region 2 of high impurity concentration, a carrier injection efficiency is increased. Further, if a breakdown voltage required for the SI thyristor is not so high, the specific resistance of the semiconductor substrate 1 may be low. In such a case, the SI thyristor is able to have a small turn ON time and forward voltage, so that a little increase of the turn ON time and forward voltage due to the radiation defects 7 is allowable.

Although the radiation defects 7 are densely and uniformly caused in the peripheral or central portion of the substrate 1 in the above embodiments, the lattice defects 7 may be caused in desired space and density distributions in the substrate 1 to implement an SI thyristor of desired characteristics. This can be achieved by making the thickness of the shading plate 13 shown in FIG. 5 uneven to vary a transmission factor of the radiation 10 in accordance with the desired space and density distributions of the radiation defects 7, or by making the scanning speed of the charged particle beam 10a shown in FIG. 6 uneven in order to vary the irradiation time of the charged particle beam 10a in accordance with the desired space and density distributions of the radiation defects 7. Further, a plurality of kinds of radiation defects may be caused in the semiconductor substrate 1 in respective desired space and density distributions to implement an SI thyristor of desired characteristics.

Although the embodiments according to the present invention have been described in detail with respect to an SI thyristor which is a sort of bipolar type device, the present invention is applicable not only to a bipolar type device but also to all semiconductor switching devices such as a MOS type device (e.g., vertical type MOS transistor) and a diode.

Although the present invention has been describe and illustrated in detail, it is clearly understood that the same is by way of illustration and example only and is not to be taken by way of limitation, the spirit and scope of the present invention being limited only by the terms of the appended claims.

What is claimed is:

1. A semiconductor switching device having a semiconductor layer through which a main current flows characterized in that said semiconductor layer is structured so that the carrier life time in said semiconductor layer is different between a first portion of said semiconductor layer serving as a path for most of said main current and a remaining portion of said semiconductor layer;

said semiconductor switching device includes a static induction thyristor comprising a first conductivity type semiconductor substrate;

a second conductivity type first electrode region formed on a back surface of said semiconductor substrate;

a first conductivity type second electrode region formed on a top surface of said semiconductor substrate; and a second conductivity type gate region formed in the middle of said semiconductor substrate to form a channel surrounded by said gate region.

* * * * *